United States Patent [19]
Yoshida et al.

[11] Patent Number: 5,310,702
[45] Date of Patent: May 10, 1994

[54] METHOD OF PREVENTING SHORT-CIRCUITING OF BONDING WIRES

[75] Inventors: Toshiki Yoshida, Huntingdon Valley, Pa.; Ryuichi Kyomasu; Toshihiro Satoh, both of Tokyo, Japan

[73] Assignee: Kulicke and Soffa Industries, Inc., Willow Grove, Pa.

[21] Appl. No.: 856,094

[22] Filed: Mar. 20, 1992

[51] Int. Cl.$^5$ .................... H01L 21/56; H01L 21/60
[52] U.S. Cl. .................... 437/211; 437/209; 437/217; 437/219; 437/220
[58] Field of Search ............ 437/211, 209, 220, 213, 437/217, 219

[56] References Cited

U.S. PATENT DOCUMENTS

| | | |
|---|---|---|
| 4,821,148 | 4/1989 | Kobayashi et al. ............ 437/211 |
| 5,013,688 | 5/1991 | Yamazaki et al. ............ 437/211 |
| 5,045,151 | 9/1991 | Edell ............ 437/211 |
| 5,053,357 | 10/1991 | Lin et al. ............ 437/211 |
| 5,057,457 | 10/1991 | Miyahara et al. ............ 437/211 |

*Primary Examiner*—Brian E. Hearn
*Assistant Examiner*—Kevin M. Picardat
*Attorney, Agent, or Firm*—John B. Sowell

[57] ABSTRACT

A method of preventing the interconnecting fine wires of a bonded semiconductor devices from moving from their preferred loop position after being bonded in an automatic wire bonder includes the step of automatically transferring the bonded semiconductor device to an insulating station prior to other operations. The interconnecting fine wires are coated in a manner which does not disturb or short the interconnecting wire which are pre-cured or cured before being transferred to a storage rack, or directly to a follow-on process step of a continuous production line.

15 Claims, 2 Drawing Sheets

METHOD OF PREVENTING SHORT-CIRCUITING OF BONDING WIRES

BACKGROUND OF THE INVENTION

1. Field of the Invention

The present invention relates to a method of preventing defects by preventing electrical short-circuiting of bonding wires during processes that come after the wire bonding step.

2. Description of the Prior Art

In recent years, the increased integration level of large-scale integrated circuit devices has meant a decrease in the spacing between bonding wires. This has given rise to a fabrication problem of short circuits caused by contact between wires or between wires and lead frames, resulting from loops and bends in the wires. Specifically, one problem is that of short circuits caused by contact between wires occurring during the wire bonding process, and another problem is that of short circuits occurring during the handling of the semiconductor device in process operations that come after the wire bonding step.

A conventional way of solving such problems has been to use bonding wire that has been precoated with an insulating material. This method is illustrated in FIG. 4 and comprises using bonding wire 11 which has been given an insulative coating beforehand. To enable the bonding to take place, a plasma-arc or mechanical technique is used to remove the coating from the primary side bonding portion 12 and secondary side bonding portion 13.

However, while the use of a plasma-arc method makes it relatively easy to remove the coating from the bowl-shaped primary bonding portion, there has ben a lack of an effective method of removing the coating from the secondary bonding portion. Experiments have been conducted relating to the use of abrasion techniques and the like to expose the bonding surface, but in terms of reliability the bonding thus achieved is inferior compared to bonding effected after complete removal of the coating.

Furthermore, even when the coating is removed, a drawback has been the complex and time-consuming task removing the particles and fragments produced by the process of removing the coating. Moreover, high-cost wire bonding systems are idled for the extended time it takes to carry out this task of removing particles and fragments, thereby reducing equipment operation rates.

Through the development of the high-performance wire bonding systems now in use, the number of short circuits produced during the wire bonding process is extremely low. In fact, now the main task is the prevention of short circuits arising during the handling of devices following the wire bonding process.

SUMMARY OF THE INVENTION

The object of the present invention is therefore to provide a method of fully and readily preventing wiring short circuits while maintaining reliability of wire bonds.

To attain the above object, the present invention comprises the forming an insulation coating on bonding wires after the wire bonding process. The insulation coating is formed by spray application of a coating agent or by immersing the requisite portions in a coating agent. Another effective procedure is to form an insulative coating on the entire integrated circuit device, lead frame and bonding wiring after the wire bonding operation.

The present invention therefore comprises the additional step of providing the bonding wires (or integrated circuit device and lead frame, as well as the bonding wires) with an insulation coating following the completion of the wire bonding step. The wire used in the bonding process is the same type of bare wire used in the conventional wire bonding process, and is merely coated with the insulating material after the completion of the bonding process. The operation is easy and the provision of the insulative coating effectively prevents short circuits. Moreover, coating the entire semiconductor device with a layer of insulating material protects the wires, and the coating on the wires, from the sharp edges of the integrated circuit chip and lead frame, during the molding process.

Further features of the invention, its nature and various advantages will become more apparent from the accompanying drawings and following detailed description of the invention.

DESCRIPTION OF THE PREFERRED EMBODIMENTS

Figure 1:
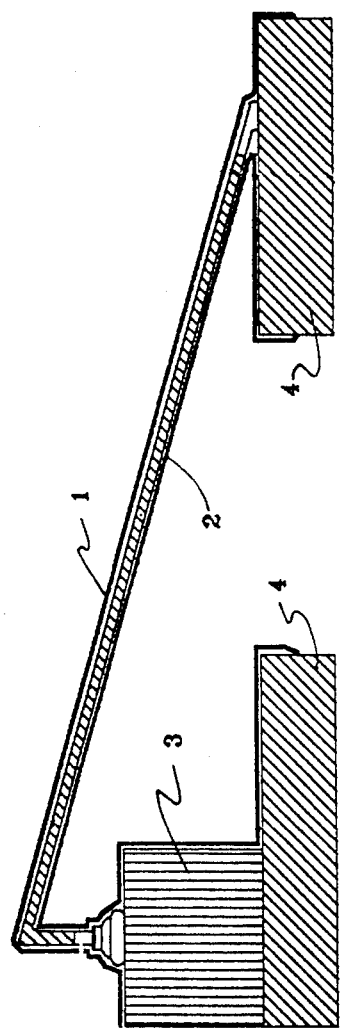
FIG. 1 is an enlarged cross-sectional view of part of a semiconductor device provided with a insulative coating according to the method of the present invention.

FIG. 1 shows an integrated circuit chip 3, a lead frame 4 and a bonding wire 2 provided with an insulation coating 1 in accordance with the method of the present invention. Short-circuiting can be prevented by applying the coating just to the bonding wire. The method according to the present invention comprises following the conventional wire bonding process with the additional step of forming a coating for preventing short-circuiting.

The wire bonding is performed by a conventional procedure using wire not provided with an insulative coating. This is followed by the application of a coating of an insulating agent to the bonded wire, thereby preventing short-circuiting during subsequent processes. Described below are methods that can be used to apply the coating.

Figure 2:
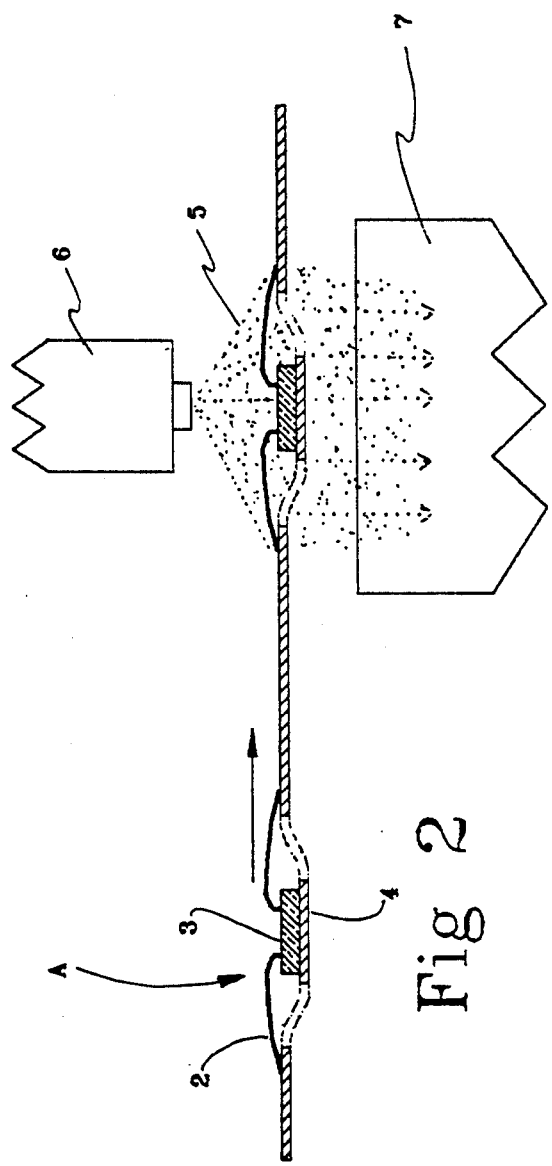
FIGS. 2 and 3 are explanatory drawings illustrating the method of forming the coating.

The insulating coating may be applied in the form of a spray. This is illustrated by FIG. 2, in which an insulating agent 5 is applied in the form of a spray 6 to a wire-bonded semiconductor device A as the device A is being conveyed onward. A vacuum suction device 7 having an associated filter means is provided beneath the spray 6 area to collect dispersed spray droplets of the insulating agent.

Figure 3:
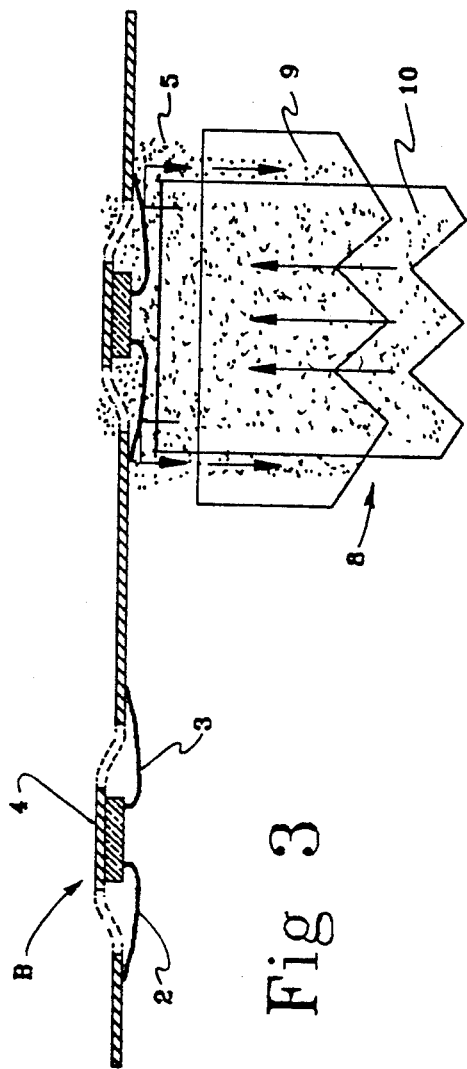
Figure 4:
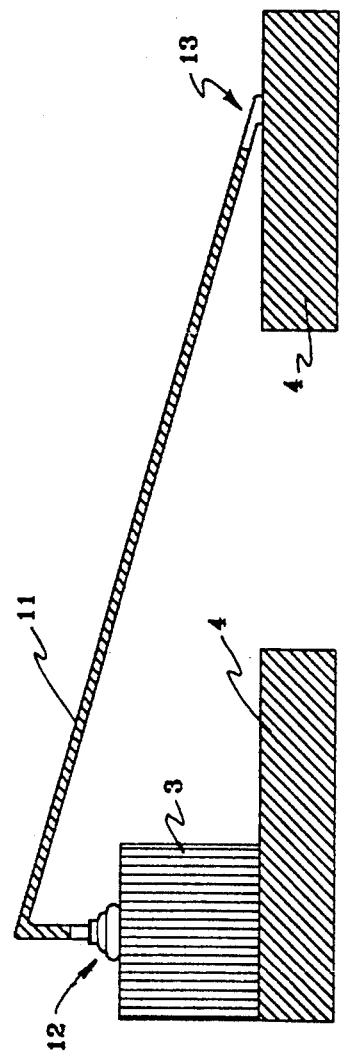
FIG. 4 is an enlarged cross-sectional view of part of a semiconductor device according to the conventional method.

The insulating coating may be directly applied by immersing the requisite portions in the insulating agent, as shown by FIG. 3. In this method, an insulating agent applicator 8 is used comprised of an upright inner cylinder 10 arranged concentrically within an outer cylinder 9. The insulating agent 5 is made to flow up and out of the inner cylinder 10 to directly coat the requisite portions of a semiconductor device B that is being conveyed onward in an upside-down orientation. The coating can instead by provided by applying the insulating agent from above.

As semiconductor devices that have been wire-bonded are susceptible to deformation and damage caused by rough handling, it is preferable that the step of applying the insulation coating directly follows the wire bonding step. As such, it is preferable for the coating arrangement to be either an integral part of the wire bonder system or to be connected to the wire bonder system.

Having explained two preferred embodiment methods of coating fine wire interconnections to provide separation and to avoid shorting between wires there are other benefits which will now be explained. The insulating agent 5 is preferably a high temperature and fast curing plastic such as epoxyphenolics, polyimides, modified silicones, teflons and polybenzimidazoles. Fast curing can be enhanced by employing ultraviolet curable plastics or additives and/or employing radiant heat which starts the curing process in a matter of seconds. In the present state of the manufacturing art it is sufficient that initial curing of the fluid insulating material is a precuring step because most wire bonded semiconductor devices are stored in sacks prior to an encapsulation process. While the present invention is particularly well adapted for high volume high lead count devices that are potted in thermo set plastic such as epoxies which do not remelt after being set, it is also applicable to thermo plastic insulating materials which will melt and reset after once being set. The initial coating of the fine wires with fluid insulating material may be carried out as the final coating, separating and insulating steps for devices that heretofore have been encapulated by being hermetically sealed in a moisture proof carrier.

Semiconductor devices for computer and/or military type application are becoming more dense and operating at ever higher frequencies which presents the problem of the interconnecting wires acting as a radiating or receiving antenna or causing capacitive coupling between wires. It is intended that the insulating material can incorporate features of high dielectric materials to decrease coupling between wires. Further, since the first insulating coating forms a stable separation coating, subsequent coatings of different insulating/dielectric or conductive materials may be employed provided they are compatible and reduce crosstalk rather than increase the problems being solved.

In the most common use of the present invention, a single coating and precuring station is incorporated and synchronized with an automatic wire bonder of the type made and sold by Kulicke and Soffa Industries, Inc. in Willow Grove, Penna., the assignee of the present invention. Such wire bonders are provided with magazines of lead frames having chips bonded thereon to be wire bonded. The semiconductor device, bonded on the leadframe, is presented at a first a coating station, then to a precuring station and is then stored into magazines for further processing in a batch operation before final curing. The precuring step provides the necessary insulation and separation of the fine wires and offers the maximum flexibility for further coating, curing and encapulation steps which may require more or less time and distinctly different types of process equipment.

We claim:

1. A method of preventing bonding wires from shorting against each other after a semiconductor chip is bonded to a carrier and placed in a wire bonding machine, comprising the steps of:

bonding interconnecting fine wires to pads on the leads on said carrier at a bonding station to provide wire bonded semiconductor device, transferring said semiconductor device from said bonding station into an insulating station without disturbing the fine wires, coating the outside of said semiconductor device and said interconnecting fine wires with a non-reactive plastic fluid insulating material in a manner which covers all exposed surfaces but does not move the interconnecting wires one against the other, removing said coated semiconductor device from said insulating station, and promptly curing said non-reactive plastic fluid insulation material sufficient to reinforce the rigidity of said fine wires in a fixed position, thereby electrically insulated one wire from the other during further handing and encapsulation.

2. The method according to claim 1 in which the step of coating comprises applying said non-reactive plastic fluid insulating material in a manner which covers the outside of gold interconnecting fine wires.

3. The method according to claim 2 wherein the step of applying said fluid non-reactive plastic insulating material comprises the step of simultaneously applying and removing excess fluid insulating material.

4. The method according to claim 1 wherein the step of applying said non-reactive plastic fluid insulating material comprises the step of spraying a mist of insulating material.

5. The method according to claim 1 wherein the step of curing comprises the step of adding a curing agent to said non-reactive plastic fluid insulating material.

6. The method according to claim 1 wherein the step of coating comprises the step of providing a high temperature plastic insulating material.

7. The method according to claim 6 wherein said high temperature plastic is selected from the group of plastics including modified silicones, polyimides, epoxyphoenolics, polybenzimidazoles and teflons.

8. The method according to claim 1 wherein the step of curing comprises pre-curing said non-reactive plastic fluid insulating material to form a permanent separation between said fine wires.

9. The method according to claim 1 wherein the step of coating comprises the step of immersing a portion of said semiconductor device in a pool of non-reactive fluid plastic insulating material.

10. The method according to claim 9 which further includes the step of removing excess fluid plastic insulating material.

11. The method according to claim 10 further includes the step of encapsulating said semiconductor device in a second non-reactive plastic material.

12. The method according to claim 11 wherein the step of curing includes the step of pre-curing and wherein the step of encapsulating include the step of post curing.

13. The method according to claim 11 wherein the step of encapsulation further includes the step of covering said coated semiconductor device by injection moulding.

14. The method according to claim 13 wherein said second insulating material comprises a thermo setting plastic.

15. The method according to claim 2 wherein said fine wires comprise non-reactive metals and the steps of coating and curing each includes a plurality of separate steps of building up a coating on the outside of said fine wires.

* * * * *